United States Patent
Atwood et al.

(10) Patent No.: US 6,212,070 B1
(45) Date of Patent: Apr. 3, 2001

(54) ZERO FORCE HEAT SINK

(75) Inventors: Eugene R. Atwood, Berkshire County, MA (US); Joseph A. Benenati; James J. Dankelman, both of Dutchess County, NY (US); Horatio Quinones, Wappingers Falls, NY (US); Karl J. Puttlitz, Dutchess County, NY (US); Eric J. Kastberg, Orange County, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/071,897

(22) Filed: May 5, 1998

Related U.S. Application Data

(63) Continuation of application No. 08/687,103, filed on Jul. 22, 1996, now Pat. No. 5,805,430.

(51) Int. Cl.⁷ ....................................... H05K 7/20
(52) U.S. Cl. .................. 361/704; 165/80.2; 165/80.3; 174/16.3; 257/719; 361/710
(58) Field of Search ................................. 165/80.2, 80.3, 165/185; 174/16.3; 257/706, 707, 712–713, 718–719, 726–727; 361/704, 707–710, 714–715, 717–720, 722, 829

(56) References Cited

U.S. PATENT DOCUMENTS

| | | |
|---|---|---|
| 4,593,342 | 6/1986 | Lindsay . |
| 4,885,126 | 12/1989 | Polonio . |
| 5,311,402 | 5/1994 | Kobayashi et al. . |
| 5,386,338 | 1/1995 | Jordan et al. . |
| 5,455,457 | 10/1995 | Kurokawa . |
| 5,464,054 | 11/1995 | Hinshaw et al. . |
| 5,805,430 | * 9/1998 | Atwad et al. ................... 361/704 |

OTHER PUBLICATIONS

IBM Tech Discl Bulletin "Thermally Efficient and Secure Module Package with Components Adaptable to Multiple Conditions of UJE", vol. 31, No. 4, 9/88, pp. 377–379. 257/718.*

"Heatsink Attachment for Improved Electro–Magnetic Compatibility and Shock Performance", IBM Technical Disclosure Bulletin, vol. 38, No. 03, Mar. 1995, pp. 383–386.

* cited by examiner

Primary Examiner—Gregory Thompson
(74) Attorney, Agent, or Firm—McGuireWoods, LLP; Ira D. Blecker, Esq.

(57) ABSTRACT

A heat sink in a heat transfer relationship with a substrate such as an integrated chip, chip carrier, or other electronic package. The heat sink is connected to a frame which is connected to a printed circuit board or other suitable support on which the substrate is positioned. The heat sink, which extends through an aperture in the frame is coupled to a surface of the substrate. The heat sink is mechanically decoupled from the substrate. Large heat sinks may be thermally connected to surface mount substrates mounted using technologies such as ceramic ball or column grid arrays, plastic ball or column grid arrays, or solder balls or columns. The heat sink is attached coaxially through the aperture to the substrate. After assembly and lead/tin or other metallic surface mount interconnects are relaxed such that the substrate and is completely supported by the frame and the heat sink imparts zero or nearly zero downward force. Because the heat sink moves freely within the aperture during assembly, the heat sink package is useful for a variety of different substrates. Preferably, the frame is a plate and a plurality of studs. The plate material are selected to match the thermal expansion of the underlying support, and the stud material matched the thermal expansion of the substrate. Thus, the frame construction allows matching expansion and contraction of the assembly to the underlying substrate and support.

40 Claims, 5 Drawing Sheets

ZERO FORCE HEAT SINK

CROSS-REFERENCE TO RELATED APPLICATIONS

This application is a continuation of U.S. Pat. application Ser. No. 08/687,103, filed Jul. 22, 1996, now U.S. Pat. No. 5,805,430.

BACKGROUND OF THE INVENTION

1. Field of the Invention

The present invention generally relates to heat sink assemblies and, more particularly, to a technique and assembly arrangement wherein a heat sink is positioned in thermal contact with a substrate such as an integrated circuit chip or electronic package but does not impart any stressful forces on the substrate, thereby avoiding damage to interconnect both at the heat sink substrate interface and at the substrate underlying support interface.

2. Background Description

Modern integrated circuit chips, chip carriers, and other electronic substrates and the use of higher powers in these devices mandate a need for better heat dissipation schemes. Current industry solutions have included the use of active heat sinks or elaborate structures to improve the thermal load carrying capacity of select components; however, these approaches tend to add undesirable cost and complexity, and also reduce reliability of the final system design.

A simple solution appears to be the use of larger and heavier heat sinks since limitations in heat sink mass limit the range of allowable electronic package power dissipation. However, larger and heavier heat sinks have not proven effective, particularly when they are applied to surface mounted components. There are serious constraints linked to the amount of heat sink mass which can actually be supported without adversely affecting the reliability of the interconnections to surface mounted components. Large mass heat sinks cause excessive stresses to both first and second level interconnections (i.e., component to heat sink being the site of first level interconnections, and component to circuit card being the site of second level interconnections) during shipping and/or over the machine life time, resulting a degradation to interconnection geometry and subsequently package interconnection reliability.

In certain circumstances substituting pin through hole connections for surface mount structures is not a viable option. Therefore, it would be advantageous to provide an effective mechanism and methodology which allows using high mass heat sinks with surface mounted electronic packages and components.

U.S. Pat. No. 5,386,338 to Jordan et al. and U.S. Pat. No. 5,464,054 to Hinshaw et al. each show a spring clamp mechanism for securing a heat sink to a mounting frame. In operation, an electronic device package is positioned within an aperture of a mounting frame, and the heat sink is secured to the mounting frame using a spring clip which fits across the heat sink and has projecting ends which are flexed to a point underneath tab members on the mounting frame. The patents also discuss the possibility of eliminating the mounting frame and securing the projecting ends in specially designed recesses positioned outside a socket connection in a circuit board which receives the electronic package. The configurations described in Jordan and Hinshaw each require a constant spring force to be applied against the surface of the electronic package, and would be wholly inappropriate for electronic packages that use surface mount interconnections.

U.S. Pat. No. 4,885,126 to Polonio shows, in FIGS. 31 and 41, a packaging system wherein integrated circuit chips are housed in recessed regions in a housing that is connected to a printed circuit board using pin connections. A convection heat sink is bonded to the top of the housing forming a hermetic seal for the chips in the housing. However, like Jordan and Hinshaw, Polonio relies on a compressive spring force to maintain thermal contact between the chips in the housing and the heat sink. In Polonio, the spring members are positioned between the top of the integrated circuit chips and the bottom of the heat sink, and are compressed at the time of creating the hermetic seal. In addition, Polonio is not related to and does not address problems that arise with surface mount components.

U.S. Pat. No. 4,455,457, to Kurokawa discloses several different packaging arrangements for semiconductors that are designed to increase thermal dissipation. In each configuration, a chip is positioned within a recess in a housing that is equipped with pin connectors for connection to a circuit board, and a heat diffusing plate contacts the top of the chip and serves to transfer heat from the chip to a heat sink positioned on top of the housing. Kurokawa relies on an elastic bias from a metallic member positioned between the diffusing plate and the heat sink to maintain contact between the diffusing plate and the chip. The heat sink is attached directly to the heat sink. The Kurokawa reference does not discuss arrangements which would be suitable for surface mount technologies.

U.S. Pat. No. 5,311,402 to Kobayashi describes an integrated circuit device fitted inside a chip holder where the integrated circuit device is adhesively bonded to a cap, and where the cap fits within grooves on an underlying substrate. The Kobayashi patent is mainly directed to positioning a chip on a circuit board, and is not concerned with heat sinks or the adverse impact of a heavy element on interconnections when the heavy element is connected to a device or substrate.

SUMMARY OF THE INVENTION

It is an object of this invention to provide an electronic packaging arrangement and method which allows a heat sink to be in thermal communication with a substrate such as an integrated circuit chip or chip package without imparting stress to the substrate or its interconnections.

It is another object of this invention to provide a heat sink packaging arrangement and method which is adaptable to a wide range of substrates and which is not subject to exacting manufacturing or assembly tolerances.

It is still another object of this invention to provide a heat sink packaging arrangement which allows large heat sinks to be used in conjunction with surface mounted substrates and components that avoids stresses to both first and second level interconnect.

It is another object of this invention to provide a heat sink packaging arrangement that is closely matched to the thermal expansion characteristics of the substrate being cooled and the support on which the substrate is surface mounted.

According to the invention, a high mass heat sink is positioned and restrained in a manner wherein the mass of the heat sink is mechanically decoupled from the substrate (e.g., chip, electronic package, etc.), while at the same time the heat sink is held tightly and positioned in intimate contact with the substrate to allow for heat dissipation. A frame is mounted to a support on which the substrate is mounted, such as a printed circuit board, circuit card, or other device, and is positioned above the substrate.

Preferably, the frame is made in a manner which provides sufficient clearance in the X, Y, and Z dimensions to accommodate neighboring components to the substrate which are attached to the support. The frame has an aperture in its top which is aligned with the substrate to be cooled.

A heat sink, which preferably has a large fan-like convection portion and a narrower slug region for dispersing the thermal energy, is connected to the frame by adhesive bonding or other means, including mechanical connections, with its narrower region extending coaxially through the aperture in contact with the substrate. Preferably, the fan-like convection region is spaced away from the top of the frame and the connection to the frame is made only in the aperture region, thereby limiting the transfer of heat to the frame. This allows the frame to have thermal expansion characteristics closely matched to the substrate being cooled and the underlying support. In a specific embodiment, the frame is comprised of two parts referred to as a plate which includes the aperture and vertical members called studs which are used to space the plate above the substrate, and the plate is made of a material selected to match the thermal expansion characteristics of the support such that it expands and contracts in the X-Y dimensions the same as the support, and the studs are made of a material selected to match the thermal expansion characteristics of the substrate such that they expand and contract in the Z dimension the same as the substrate.

A thermal connection is made to the substrate by depressing the heat sink against the substrate via coaxial movement through the aperture. Once in place, the heat sink is connected to the aperture. While there is a downward force on the substrate during assembly of the heat sink, this force is quickly dissipated by relaxation of the mounting members underneath the substrate. For example, with surface mount technologies such as ceramic ball grid arrays, ceramic column grid arrays, plastic ball grid arrays, plastic column grid arrays, solder balls, and solder columns, the metallic elements, such as lead/tin will undergo stress relaxation also known as "creep". This stress relaxation will reduce the applied assembly force to very low values including zero stress such that there is reduced or zero stress on the package interconnections after assembly, and all the weight of the heat sink is supported by the frame instead of the substrate being cooled. Thermal grease or other heat transfer mediums can be positioned between the bottom of the heat sink and the top of the substrate to assist in transfer of thermal energy from the substrate to the heat sink.

The apertured design of the frame allows a variety of different sized substrates to be accommodated by a single frame. That is, both taller and shorter components can be fitted under the frame, and the heat sink connection to the frame can be made at varying regions on the side of the slug region of the heat sink simply by moving it coaxially through the aperture. This feature allows greatly relaxed manufacturing tolerances such as dimensions and coplanarity. The aperture itself can be fabricated with ridged regions which can either mechanically connect the heat sink to the frame or aid in the connection. Ridged members will also serve to direct the heat sink to an upright orientation and direct the heat sink downward towards the substrate. The aperture can be made in a variety of different geometries and the frame can be connected to the support by a variety of different connectors.

BRIEF DESCRIPTION OF THE DRAWINGS

The foregoing and other objects, aspects and advantages will be better understood from the following detailed description of the preferred embodiments of the invention with reference to the drawings, in which.

DETAILED DESCRIPTION OF A PREFERRED EMBODIMENT OF THE INVENTION

This invention pertains to decoupling those forces generated by a heat sink mass from an underlying substrate, and particularly a surface mounted substrate. Decoupling a force due to the heat sink mass from the electronic package and its interconnection structure enables and simplifies the use of larger and heavier heat sinks. The use of high mass heat sinks enables higher power dissipations for a given electronic package type. According to this invention, decoupling is accomplished by using a rigid frame to support the weight of the heat sink while maintaining the heat sink in thermal contact with the electronic package. When subjected to vibration and/or shocks during transportation or operation, the frame restrains and limits the displacement of the heat sink relative to the electronic package. Additionally, the frame transfers static and dynamic loading from the heat sink directly to the underlying printed circuit board or card.

Figure 1:
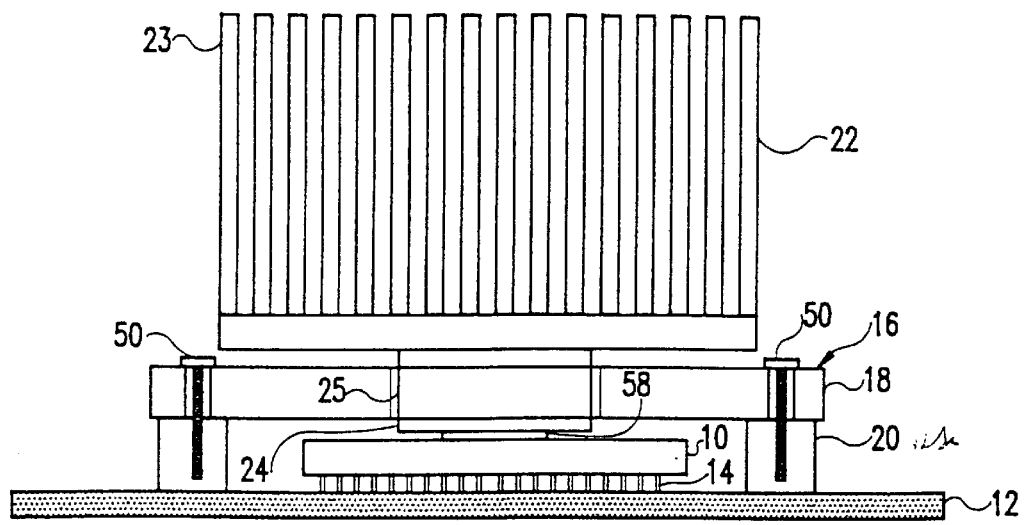
FIG. 1 is a cross-sectional side view of a substrate surface mounted to a support with a heat sink in thermal contact with the substrate which is supported by a frame that is connected to the support.

FIG. 1 shows a substrate 10 positioned on a support 12. The substrate 10 can be any of a variety of electronic components that require thermal dissipation including integrated circuit chips, electronic packages, multilayer modules, etc. The support can be any of a variety of devices including printed circuit boards or cards, ceramic or composite boards and cards, etc. Furthermore, this invention is particularly beneficial for use with substrates 10 which are surface mounted to supports 12; therefore, FIG. 1 depicts a surface mount interconnection 14 which can be of any of a variety of arrangements including ceramic ball grid arrays, ceramic column grid arrays, plastic ball grid arrays, plastic column grid arrays, solder balls, or solder columns. Examples of these types of surface mount interconnections are described in IBM Journal of Research and Development, Vol. 37, #5, September 1993, and R. Tummala, E. Rymaszewski, *Microelectronics Packaging Handbook.*

While FIG. 1 depicts a surface mount interconnection 14, it should be understood that features of this invention will be useful for all standard electronic packages and I/O configurations, such as Ball Grid Arrays, Land Grid Arrays, Quad Flat Packages (QFP), lead frame, socketed, pin-in-hole, etc.

A frame 16 comprised of a plate 18 and several studs 20 is positioned over the substrate 10 and preferably has sufficient clearance therefrom in the X, Y, and Z directions to accommodate any neighboring components (not shown) of the substrate 10. The frame 16 should be sufficiently rigid to support the weight of the heat sink 22. Suitable materials for the frame 16 may include fiberglass, fiber reinforced plastic, aluminum, phenolic, Kovare, and Delrons. The size of the frame 16 can vary widely and depends on the size of the substrate 10 to be cooled and the size of the heat sink 22 to be supported. For example, the substrate 10 could be ceramic, alumina/glass, alumina nitride or polymeric, which have the following typical dimensions 15–50 mm length, 15–50 mm width, and 1.5–20 mm height, and the heat sink material could be aluminum or copper with masses ranging up to approximately 5 kilograms (kg), and the size of the frame 16 would need to be large enough to accommodate the substrate 10 and strong enough to support the heat sink 22.

Figure 4:
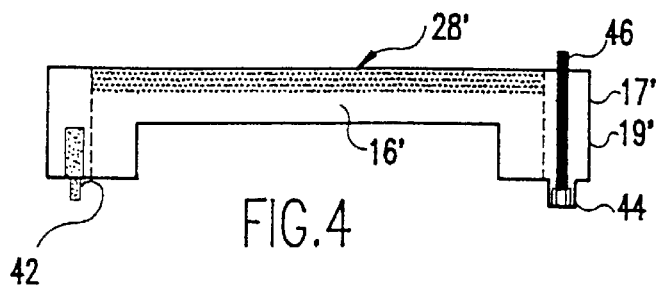
FIG. 4 is a side view of an alternative frame configuration which illustrates two alternative connectors which can be used to secure the frame to a support.

FIG. 1 illustrates the preferred embodiment of the invention where the frame is comprised of a separate plate 18 and several studs 20; however, the frame 16' could also be of unitary construction as is shown in FIG. 4. One particular advantage of the two-piece construction is that it allows for matching the thermal expansion and contraction characteristics of both the substrate 10 and the support 12. The plate 18 would preferably made from a material which matches the coefficient of thermal expansion of the support 12 so that it will expand or contract in the X and Y plane of the support 12 at the same rate as the support 12. For example, if the support 12 is a printed circuit board made from fiber reinforced plastic, it will have a coefficient of thermal expansion ranging between 15 $E^{-6}/°$ K and 23 $E^{-6}/°$ K. The plate 18 could be chosen to made from the same material as the support 12, or could be metal, plastic, Kovar, or ceramic with a thermal expansion sufficiently matched to be compatible with the expansion of support 12. Preferably, the coupled expansion of the assembly composing the substrate 10, its attachment 14 to support 12, and the heat sink stud or slug 24 is to be roughly equivalent to the expansion of the material selected from the studs 20. For example, using the following elements: alumina substrate, PbSn solder, aluminum heat sink, and silicon die, an appropriate stud material would have a coefficient of thermal expansion of approximately 13 $E^{-6}/°$ K, and could be metal (e.g., Alloy 42–42% Nickel and 58% iron, Kovar) or ceramic. Because of the different characteristics which may arise between the substrate 10 and support 12, the coefficients of thermal expansion of the plate 18 and studs 20 can be different.

While FIG. 4 shows a unitary construction for frame 16', it should be understood that the frame 16' might be made with the top 17' thermally matched to the support and the mounting legs 19' thermally matched to the substrate, interconnect, heat sink combination, to achieve the benefits discussed above, where the top and mounting legs would be glued or molded together to form the unitary structure.

Figure 3:
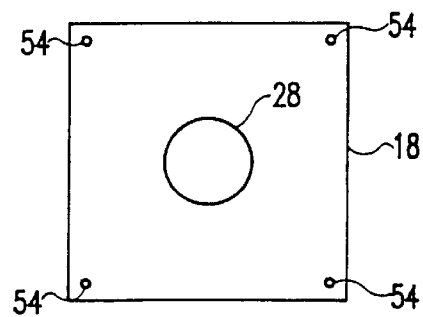
FIG. 3 is a plan view of a plate which forms part of a frame.
Figure 6:
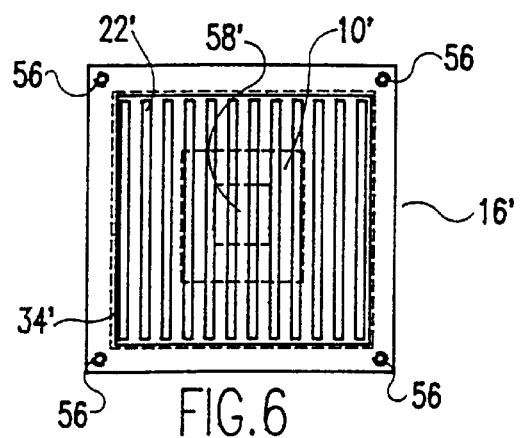
FIG. 6 is a plan view of the heat sink assembly shown in FIG. 4.

FIG. 1 illustrates a preferred mounting arrangement for the heat sink 22 whereby it is joined to the frame 16 at a region on its lower "slug" portion 24 by a connection 25 positioned in an aperture in plate 18. FIG. 3 shows the aperture 28 in plate 18. The aperture 18 can be any geometry and will be selected to accommodate the type of heat sink 22 to be used. For example, FIG. 3 shows a round aperture, while FIG. 6 show a square aperture. Different sized substrates 10, through a large tolerance range, can be accommodated simply by moving the slug 24 of the heat sink 22 within the aperture 18 (either coaxally or slightly non-coaxially). In the configuration shown in FIG. 1, the weight of the heat sink 22 is supported by the frame 16 which is connected to support 12, and not by the substrate 10. Thus, the configuration imparts very little or no stress on the interconnections (first or second level) of the substrate 12. In addition, the fan region 23 of heat sink 22 is spaced away from the top surface of frame 16 so that heat energy supplied by the substrate 10 will not be passed to the frame 16 from the heat sink 22 except at the aperture 28. Thus, the frame 16 will retain thermal expansion characteristics similar to the support 12.

Figure 7A:
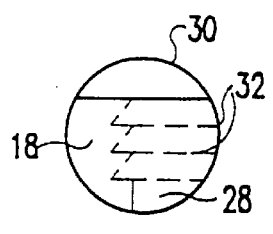
FIGS. 7a and 7b are enlarged side views of an aperture in a frame showing ridge formations in the aperture.
Figure 7B:
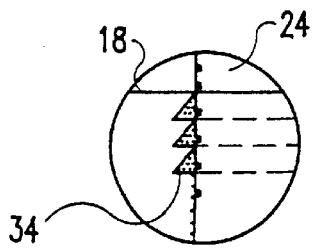

The connection 25 at the aperture 28 can be by any practical means which will transfer the weight of the heat sink 22 to the frame 16, yet maintain the heat sink 22 in position in thermal contact with the substrate 10. FIGS. 7a and 7b illustrate a preferred embodiment of this invention where the aperture 28 in plate 18 has a region 30 with ridges 32 formed therein, and where an adhesive material 34, such as glue, epoxy (e.g., Hardman Epoxy #4005), or Loctites structural adhesive 324/326 is positioned in the aperture 28 between the slug 24 of heat sink 22 and plate 18. FIG. 7b shows that the side wall of the slug 24 can be contoured 36 to accommodate adhesive material 34. The ridges 32 provide adhesion enhancement of the heatsink slug 24 to the plate aperture 28. Although not illustrated, it will be apparent to those skilled in the art that the heat sink 22 may also be mechanically connected to the frame 16 using clips, screws, and other mechanical fasteners, as well as friction fits or other mechanisms that will couple the heat sink 22 to frame 16.

Figure 2:
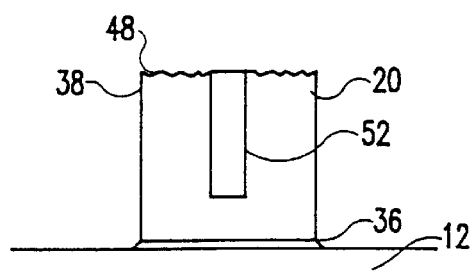
FIG. 2 is a cross-sectional side view of a stud surface mounted to a support such as a printed circuit card or other device.

FIG. 2 illustrates a preferred embodiment of a stud 20 where it includes a support contacting end 36 and a plate contacting end 38. The support contacting end 36 can be secured to support 12 by any of a variety of different techniques. For example, FIG. 2 shows a surface mounting technique where the support contacting end is secured to the surface of support 12 with a material 40 such as a solder, brazing material, or an adhesive. Alternatively, FIG. 4 shows that a screw 42 can be passed through the support 12 to secure a stud 20 or the base of a frame 16' to a support, or an expansion collet 44 can be passed through the support 12 and be selectively expanded to make a connection therewith using push-down member 46 that will slide through a passage in the stud 20 or frame 16'. The technique for mounting the frame 16 or 16' to the support 12 should be of stability sufficient to withstand vibrations and/or shocks which may be encountered during shipping and operation of the equipment which utilizes the substrate 10.

With reference to FIGS. 1–3, a plate contacting end 38 of the stud 20 preferably is embossed or otherwise roughened so as to be uneven on its top surface 48 such that after the connecting screws 50 are seated in the bore holes 52, lateral movements of the plate 18, as would occur due to shock or vibration, will be more easily resisted, thereby maintaining the heat sink 22 centered above the substrate 10. The studs 20 can be connected at various screw aperture sites 54 in plate 18, and FIG. 3 illustrates connections at the four corners of the plate 18. The positioning of the screw aperture sites 54 and the number of screw aperture sites 54 can vary considerably and can be adapted for space and position requirements of circuitry and components (not shown) underlying the plate 18 and the configuration of support 12. Likewise, if a unitary frame 16' such as that shown in FIG. 4 is used, the position of the connectors can be varied (FIG. 6, like FIG. 3 shows connectors 56 at the four corners of the frame 16').

Figure 5:
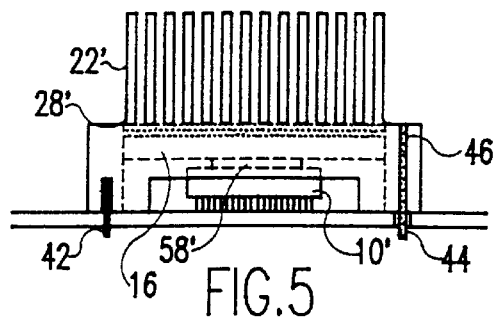
FIG. 5 is a side view of the frame shown in FIG. 4 mounted to a support with a heat sink attached that is in thermal contact with a substrate.

FIGS. 4–6 illustrate an embodiment of the invention where a square heat sink 22' is positioned within a large square aperture 28' in frame 16'. As discussed above, connection between the frame 16' and heat sink 22' can be made using an epoxy 34' deposited in the aperture 28' between the heat sink 22' and frame 16', or by other suitable means, including mechanical connections, which will be sufficient to support the weight of the heat sink 22' and to maintain the heat sink 22' in thermal contact with the substrate 10'.

Both FIG. 1 and FIG. 5 show the use of a thermal grease 58 or 58'or other suitable thermal medium (tapes, oils, etc.) between the substrate 10 or 10' and the heat sink 22 or 22'. The thermal grease 58 or 58'is used to transfer and distribute heat more efficiently between the substrate and heat sink. Suitable thermal tape or grease mediums are commercially available from General Electric, Al Technology, Inc., Dow Corning, and Chometrics. In the preferred embodiment the heat sink 22 or 22' will not be bonded to the substrate 10 or 10' (e.g., the grease 58 or 58' should not have an adhesive property). The lack of "bondings" assures that the heat sink is mechanically decoupled from the underlying substrate. While FIGS. 1 and 5 show the thermal grease 58 or 58' as a layer it should be understood first that the grease is not required to practice the invention, and second that the grease 58 or 58' would be spread very thinly across the top surface of the substrate 10 or 10' and bottom surface of the heat sink 22 or 22'.

With reference back to FIG. 1, the heat sink assembly will preferably be fabricated by attaching a substrate 10 to a support 12 and attaching a frame 16 to the same support 12 at a position which overlies the substrate 12, and where an aperture 28 in the frame 16 allows a portion of a heat sink 22 to pass therethrough and to thermally contact the substrate 10. The heat sink 22 will be pressed downward towards the substrate with a lower portion of the heat sink moving through the aperture 28 and into thermal contact with the substrate 10. Prior to pressing the heat sink 22 downward, a thermal grease 58 can be added between the base of the heat sink 22 and the top of the substrate 10. In order to be useful, the heat sink 22 must make good thermal contact with the substrate 10. The coaxial forces which electronic packages will experience is in the range of up to 1500 force grams or more. Once the heat sink 22 is pressed firmly against the substrate 10, it should be firmly connected to the frame 16 using connection 25, such as an epoxy glue or other suitable adhesive 34 deposited in the aperture 28 in the frame, or by mechanical fastener or the like. Thus, the weight of the heat sink 22, which for most applications will range between 30 g and 1 kg, will be supported entirely by the frame 16, and will also be firmly held in thermal contact with the substrate 10.

The invention is particularly advantageous when surface mount interconnections 14 are used for the substrate. During the process of affixing the heat sink 22 to the frame 16, a force will be applied to the substrate 10 and interconnection 14. However, with surface mount interconnections the solder and/or other materials will dissipate the stress imparted through stress mechanisms. Thus, the forces generated during assembly will have been dissipated through relaxation to provide stress-free substrate attachments 14. This stress-free state is maintained by the elements taught by this invention.

Figure 8:
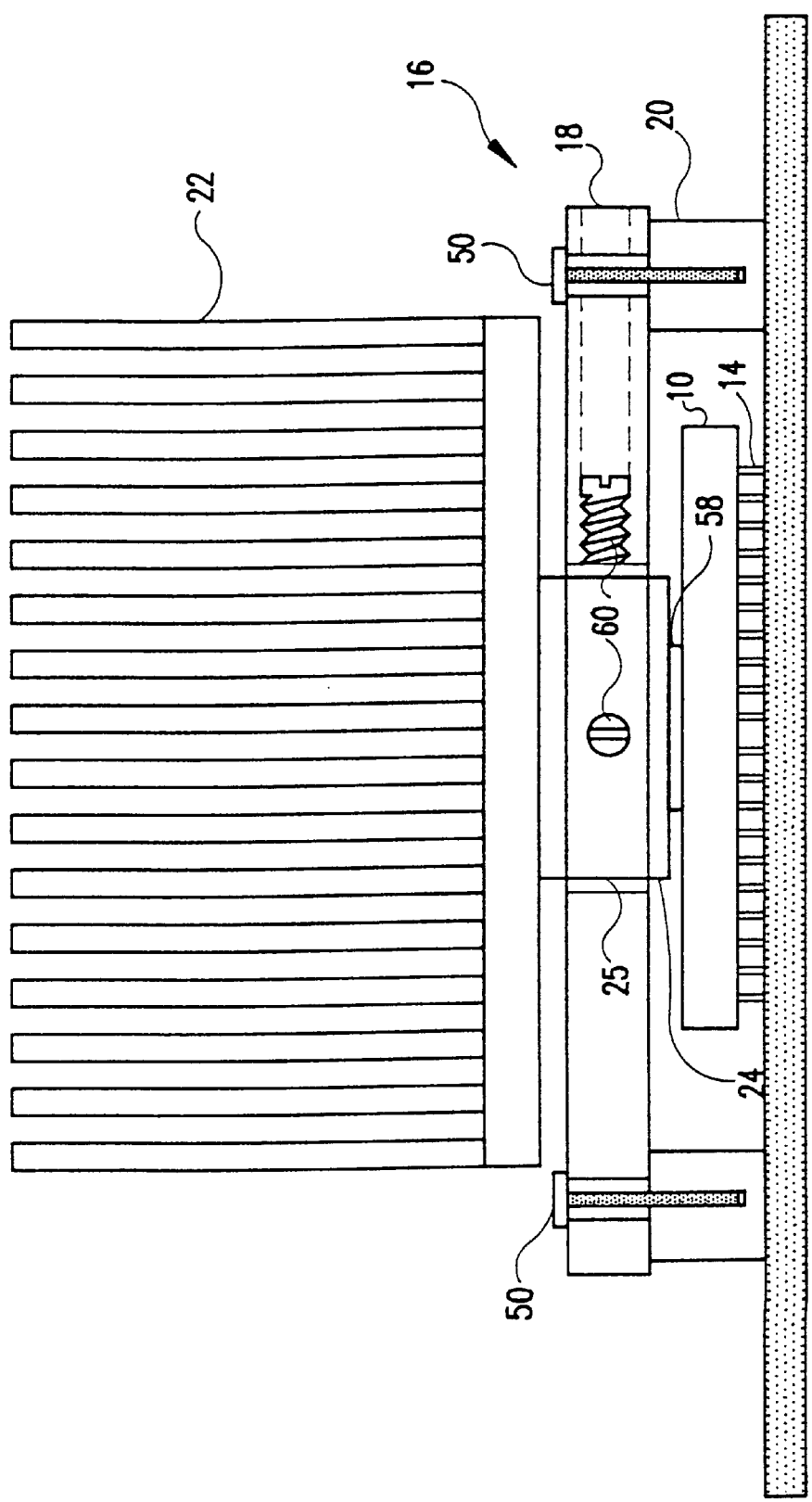
FIG. 8 is a cross-sectional side view of the heat sink assembly shown in FIG. 1 wherein a set screw is used to connect the heat sink to the frame.
Figure 9:
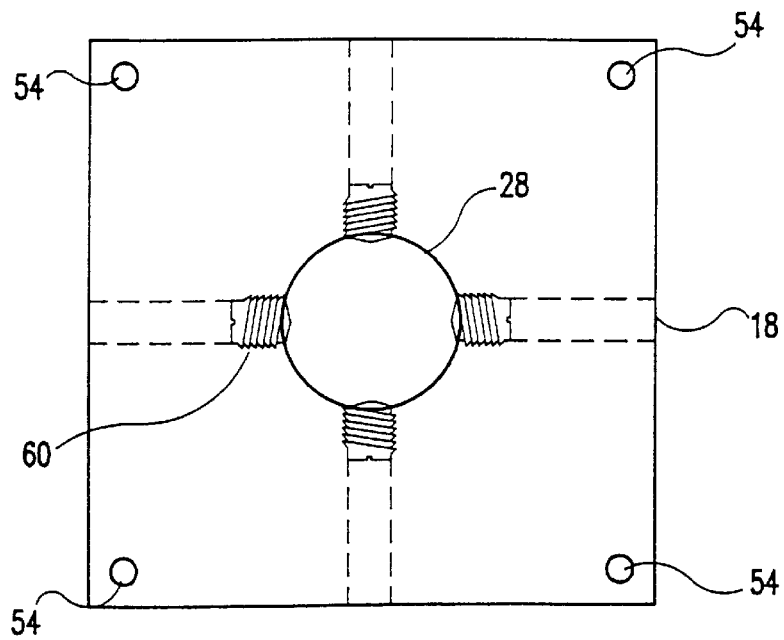
FIG. 9 is a plan view of the plate shown in FIG. 3 showing set screws projecting into the aperture.
Figure 10:
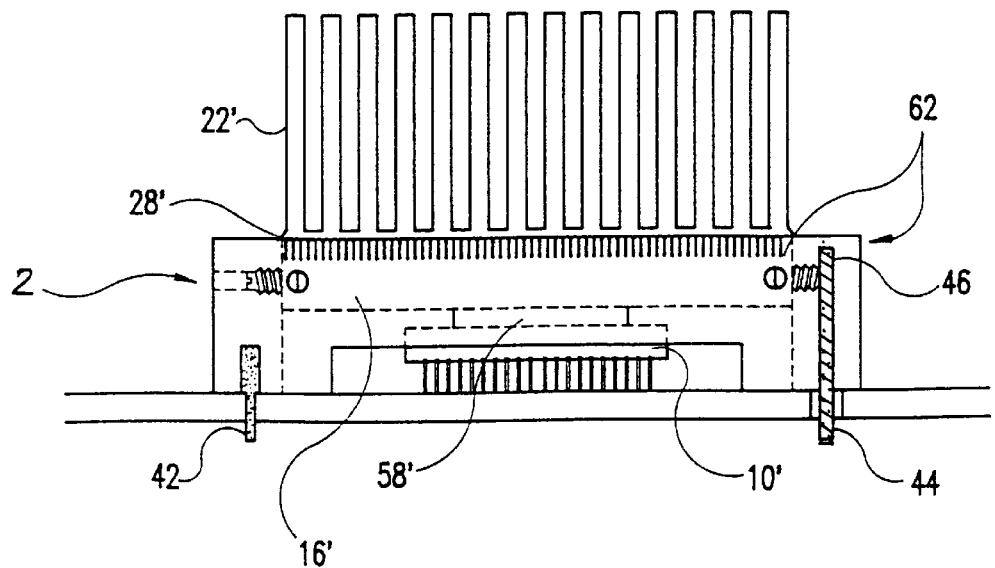
FIG. 10 is a side view of the heat sink assembly shown in FIG. 5 wherein set screws are used to connect the heat sink to the frame.
Figure 11:
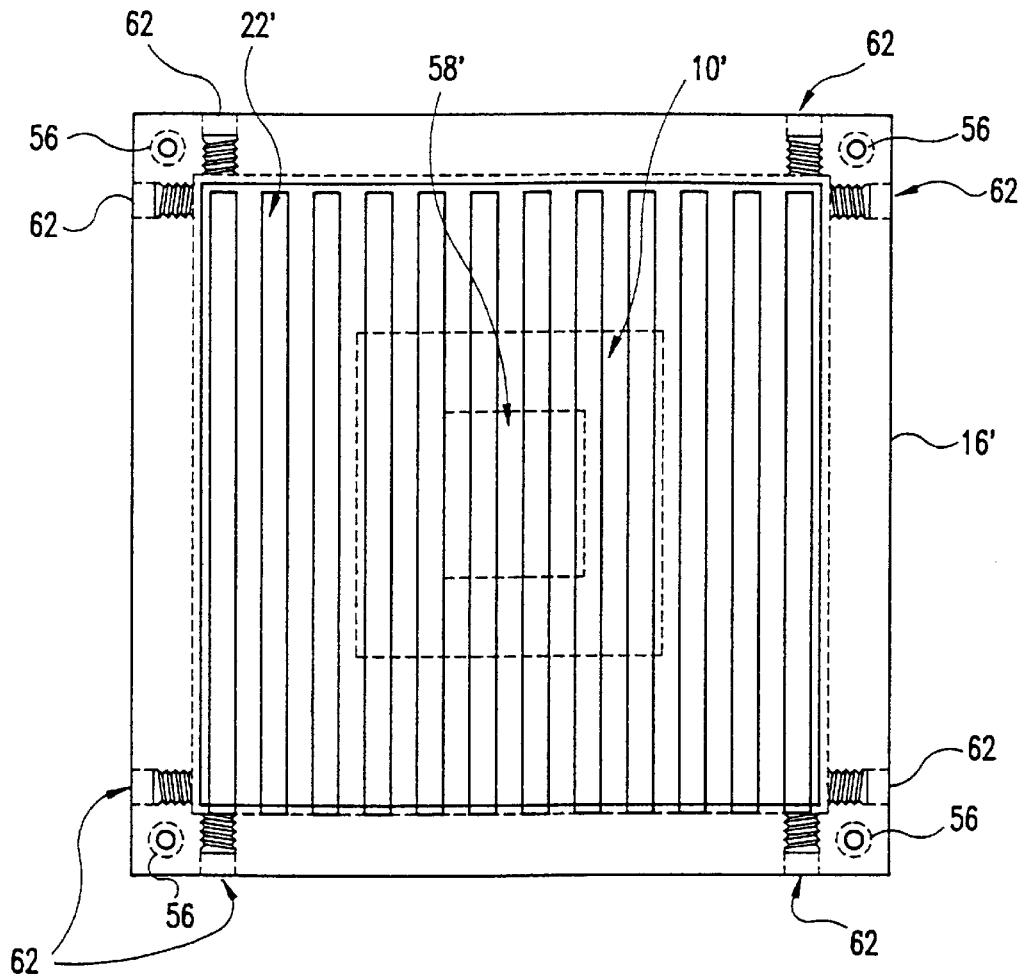
FIG. 11 is a plan view of the heat sink assembly shown in FIG. 6 showing the set screws connecting the heat sink to the frame.

FIGS. 8–11 show various mechanical connector arrangements that can be used in the practice of this invention as alternatives to an adhesive bonding agent shown in FIG. 7b. These mechanical connector arrangements will also result in stress-free substrate attachments 14 since they do not rely on continuous downward force being exerted on the frame. With reference to FIGS. 8 and 9, which are similar to FIGS. 1 and 3, respectively, it can be seen that a plurality of set screws 60 passing through the plate 18 into aperture 18 can be used to secure the heat sink 22 to the frame 16. With reference to FIGS. 10 and 11, which are similar to FIGS. 5 and 6, respectively, it can be seen that a plurality of set screws 62, located in the corner regions of the frame 16', can be used to secure the heat sink 22' to the frame 16'.

While the invention has been described in terms of its preferred embodiments, those skilled in the art will recognize that the invention can be practiced with modification within the spirit and scope of the appended claims.

We claim:

1. An electronic structure, comprising:

a substrate mounted on a support and having a stress-free attachment to said support;

a frame with an aperture;

a heat sink rigidly attached to and held in place by said frame in orthogonal lateral axes and a third axis absorbing downward force on said substrate, said third axis being orthogonal to said lateral axes, and which is in thermal contact with said substrate through said aperture in said frame; and means, connected to said frame but not said substrate, for connecting said frame to said support and maintaining said heat sink in thermal contact with said substrate, whereby said frame substantially supports said heat sink, such that said heat sink, such that said substrate attachment is maintained in a stress-free state, any force applied to said substrate by said heat sink being essentially zero.

2. The electronic structure of claim 1 wherein said substrate is mounted on said support using a surface mount interconnection.

3. The electronic structure of claim 2 wherein said surface mount interconnection is selected from the group consisting of ceramic ball grid arrays, ceramic column grid arrays, plastic ball grid arrays, plastic column grid arrays, solder balls, and solder colmuns.

4. The electronic structure of claim 1 wherein said heat sink is connected to said frame by an adhesive material positioned between said heat sink and said aperture in said frame.

5. The electronic structure of claim 4 wherein said adhesive material is glue.

6. The electronic structure of claim 4 wherein said heat sink has a first end which is in said thermal contact with said substrate and a second end, which i is larger than said first end, for dissipating heat from said substrate, and wherein said second end of said heat sink is spaced away from said frame.

7. The electronic structure of claim 1 wherein said frame is comprised of a plate containing said aperture, a plurality of studs positioned between said plate and said support, and connectors connecting each of said studs to said plate.

8. The electronic structure of claim 7 wherein said studs each have a first end which is secured to a surface of said support and a second end which is in contact with a surface of said plate, said second end of said studs having an uneven surface which function to resist lateral movement of said plate.

9. The electronic structure of claim 7 wherein each of said studs is a composed of a material that has an expansion which is matched to said substrate.

10. The electronic structure of claim 7 wherein said plate is composed of a material that has an expansion which is matched to said support.

11. The electronic structure of claim 7 wherein said connectors are screws which pass through said plate and are secured in said studs.

12. The electronic structure of claim 1 wherein said means for connecting said frame to said support is selected from the group consisting of screw connectors, expansion collet connectors, and surface mount connectors.

13. The electronic structure of claim 1 further comprising ridge formations formed in said aperture.

14. The electronic structure of claim 1 further comprising a thermal energy transfer medium positioned between said substrate and said heat sink for transferring thermal energy from said substrate to said heat sink.

15. The electronic structure of claim 14 wherein said thermal energy transfer medium is a thermal grease, thermal tape, or oil.

16. The electronic structure of claim 1 wherein said substrate is selected from the group consisting of integrated circuit chips, multilayer circuits, and packages for same.

17. The electronic structure of claim 1 wherein said support is selected from the group consisting of printed circuit boards, circuit cards, and substrate carriers.

18. The electronic structure of claim 1 wherein said heat sink is connected to said frame by a mechanical connector.

19. The electronic structure of claim 1 wherein said frame includes a top and a plurality of leg members connecting said top to said support, and wherein said top and said leg members are of unitary construction.

20. The electronic structure of claim 1 wherein said heat sink and said frame are rigidly connected in an axis perpendicular to said heat sink.

21. A heat sink assembly comprising:
a plate with an aperture;
a heat sink having first and second ends, said first end of said heat sink having an outer surface sized to fit within said aperture in said plate; and
means for rigidly securing said outer surface of said first end of said heat sink to said plate in orthogonal lateral axes and a third axis absorbing downward force on said substrate. said third axis being orthogonal to a lateral axes.

22. The heat sink assembly of claim 21 further comprising a plurality of studs and a means for securing each of said plurality of studs to said plate.

23. The heat sink assembly of claim 22 further comprising ridge formations formed in said aperture in said plate.

24. The heat sink assembly of claim 22 wherein said plate is made of a material having a first coefficient of thermal expansion and each of said studs are made of a material having a second coefficient of thermal expansion, and wherein said first coefficient of thermal expansion is not equal to said second coefficient of thermal expansion.

25. The heat sink assembly of claim 22 wherein said means for securing are screws which extend through screw apertures in said plate and into an end of each of said studs.

26. The heat sink assembly of claim 22 wherein each of said plurality of studs has a first end and a second end wherein said first end is securable to a support and said second end is securable to said plate, said second end of said studs having an uneven surface which functions to resist lateral movement of said plate when said studs are connected to said plate.

27. A method of thermally connecting a heat sink to a substrate to be cooled, comprising the steps of:
mounting a substrate to be cooled to a support structure;
connecting a frame with an aperture to said support structure at a location where said substrate is positioned on a first side of said frame and is adjacent said aperture in said frame;
positioning a heat sink having a first portion on a second side of said frame and a second portion in thermal contact with said substrate through said aperture in said frame;
securing said heat sink rigidly to said frame in orthogonal lateral axes and a third axis absorbing downward force on said substrate, said third axis being orthogonal to said lateral axes such that said heat sink is held in place and remains in thermal contact with said substrate; and
reducing physical forces applied from said heat sink to said substrate such that said substrate remains mounted on said support in a stress-free state.

28. The method of claim 27 wherein said step of mounting said substrate is performed by surface mounting said substrate to said support structure with a surface mount interconnection.

29. The method of claim 28 wherein said surface mounting includes the step of selecting said surface mount interconnection from the group consisting of ceramic ball grid arrays, ceramic column grid arrays, plastic ball grid arrays, plastic column grid arrays, solder balls, and solder columns.

30. The method of claim 28 wherein said step of positioning is performed by moving said heat sink within said aperture in said frame.

31. The method of claim 28 wherein said step of securing is performed by adhesively bonding said heat sink to said frame at said aperture of said frame.

32. The method of claim 29 wherein said step of reducing physical forces is performed by allowing stresses in said surface mount interconnection to relax.

33. The method of claim 28 wherein said step of securing is performed by mechanically connecting said heat sink to said frame.

34. A frame for securing a heat sink in thermal contact with a substrate to be cooled, said substrate being attached to a support, comprising:
a top having an aperture therethrough and capable of supporting said heat sink;
a plurality of mounting members which are either connected to said top or are connectable to said top, each of said mounting members projecting in the same direction from said top when connected to said top;
means for rigidly connecting each of said mounting members to a support; and
means, positioned in said aperture of said top, for rigidly connecting a heat sink to said top in orthogonal lateral axes and a third axis absorbing downward force on said substrate, said third axis being orthogonal to said lateral axes and maintaining attachment of said substrate to said support in a stress-free state, any force applied to said substrate by said heat sink being essentially zero.

35. The frame of claim 34 wherein said means for connecting said heat sink is a mechanical fastener.

36. The frame of claim 35 wherein said mechanical fastener comprises a plurality of set screws which extend within said aperture.

37. The frame of claim 34 wherein said means for connecting is a region in said aperture for receiving an adhesive bonding material.

38. The frame of claim 34 wherein said top and said mounting members are integrally joined together.

39. A heat sink assembly comprising:
- a plate with an aperture made of a material having a first coefficient of thermal expansion and each of said studs having a second coefficient of thermal expansion, said first coefficient of expansion being different from said second coefficient of expansion;
- a heat sink having first and second ends, said first end of said heat sink having an outer surface sized to fit within said aperture in said plate; and
- a plurality of studs and means for securing said plurality of studs to said plate for rigidly securing said outer surface of said first end of said heat sink to said plate.

40. A heat sink assembly comprising:
- a plate with an aperture;
- a heat sink having first and second ends, said first end of said heat sink having an outer surface sized to fit within said aperture in said plate; and
- a plurality of studs and a plurality of screws which extend through screw apertures in said plate into an end of respective ones of said studs for securing said plurality of studs to said plate and for rigidly securing said outer surface of said first end of said heat sink to said plate.

* * * * *